United States Patent
Maeda

(10) Patent No.: US 8,378,399 B2
(45) Date of Patent: Feb. 19, 2013

(54) BACKSIDE ILLUMINATION SOLID-STATE IMAGING DEVICE

(75) Inventor: Motohiro Maeda, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 13 days.

(21) Appl. No.: 13/181,711

(22) Filed: Jul. 13, 2011

(65) Prior Publication Data
US 2012/0012965 A1  Jan. 19, 2012

(30) Foreign Application Priority Data
Jul. 14, 2010  (JP) ................... 2010-160012

(51) Int. Cl.
*H01L 31/062*  (2012.01)
*H01L 31/113*  (2006.01)

(52) U.S. Cl. ........ 257/292; 257/294; 257/435; 257/447; 257/448; 257/E31.121; 257/E31.122

(58) Field of Classification Search ............ 257/291, 257/292, 294, 435, 447, 448, E31.121, E31.122
See application file for complete search history.

(56) References Cited

U.S. PATENT DOCUMENTS

| | | | | |
|---|---|---|---|---|
| 6,809,008 B1 * | 10/2004 | Holm et al. | .......... | 438/455 |
| 6,984,816 B2 * | 1/2006 | Holm et al. | .......... | 250/214 R |
| 7,755,090 B2 * | 7/2010 | Abe et al. | .......... | 257/69 |
| 7,939,359 B2 * | 5/2011 | Ohgishi | .......... | 438/57 |
| 8,035,105 B2 * | 10/2011 | Abe et al. | .......... | 257/69 |
| 2010/0155796 A1 * | 6/2010 | Koike et al. | .......... | 257/292 |
| 2011/0272772 A1 * | 11/2011 | Kokubun | .......... | 257/432 |
| 2012/0008024 A1 * | 1/2012 | Takimoto | .......... | 348/294 |
| 2012/0147241 A1 * | 6/2012 | Yamaguchi et al. | .......... | 348/311 |

FOREIGN PATENT DOCUMENTS

JP  2008-182185  8/2008
JP  2009-206356  9/2009

* cited by examiner

*Primary Examiner* — Ngan Ngo
(74) *Attorney, Agent, or Firm* — Oblon, Spivak, McClelland, Maier & Neustadt, L.L.P.

(57) ABSTRACT

According to one embodiment, a backside illumination solid-state imaging device includes a semiconductor layer, a first light-receiving unit and a second light-receiving unit, a circuit unit, an impurity isolation layer, and a light-shielding film. A first light-receiving unit and a second light-receiving unit are formed adjacent to each other in the semiconductor layer, convert light applied from a lower surface side of the semiconductor layer into a signal, and store electric charges. A circuit unit is formed on an upper surface of the semiconductor layer. An impurity isolation layer is formed to reach to the upper surface from the lower surface in the semiconductor layer and isolates the first light-receiving unit from the second light-receiving unit. A light-shielding film is formed on part of the lower surface side in the impurity isolation layer so as to extend from the lower surface to the upper surface.

19 Claims, 5 Drawing Sheets

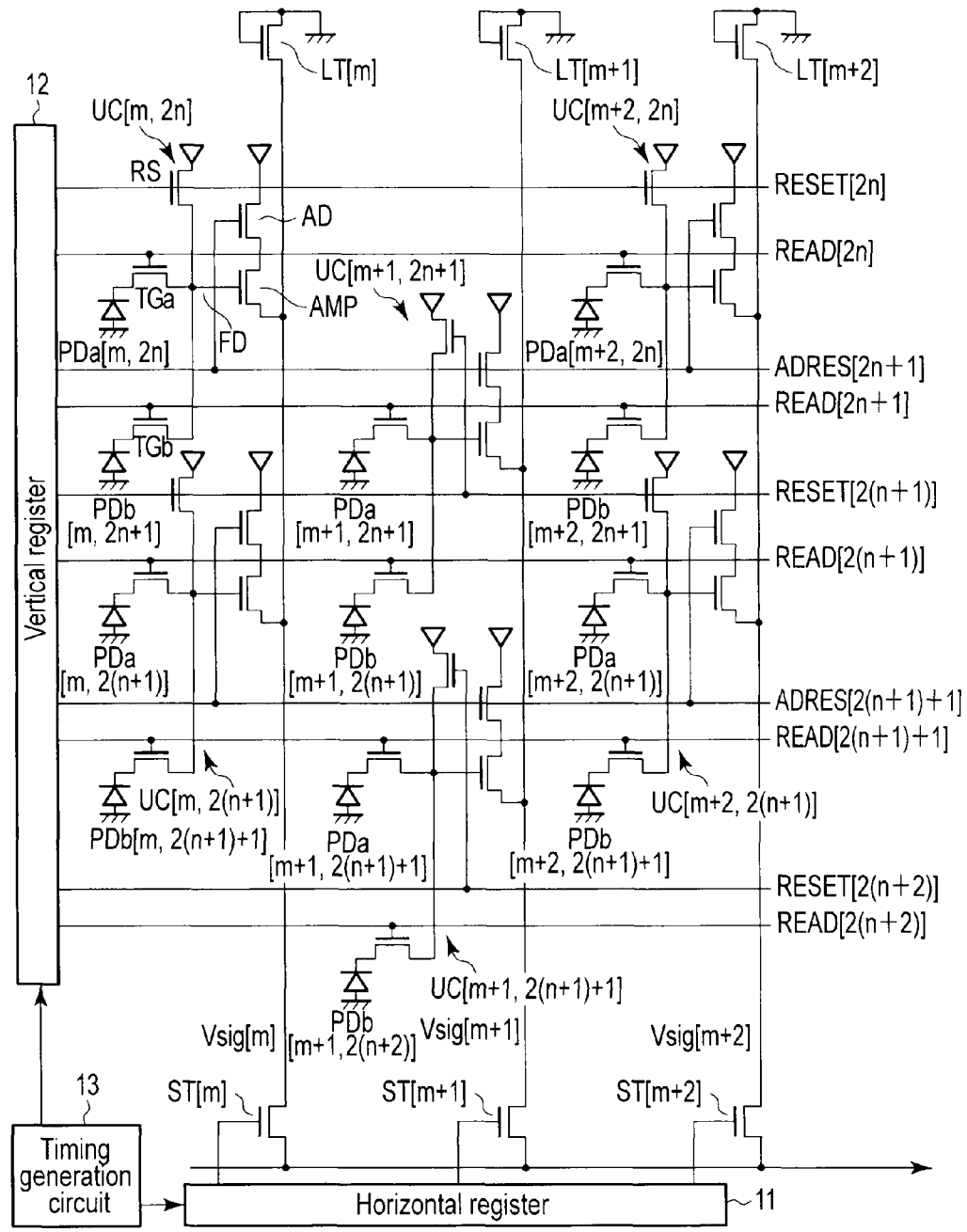
F I G. 1

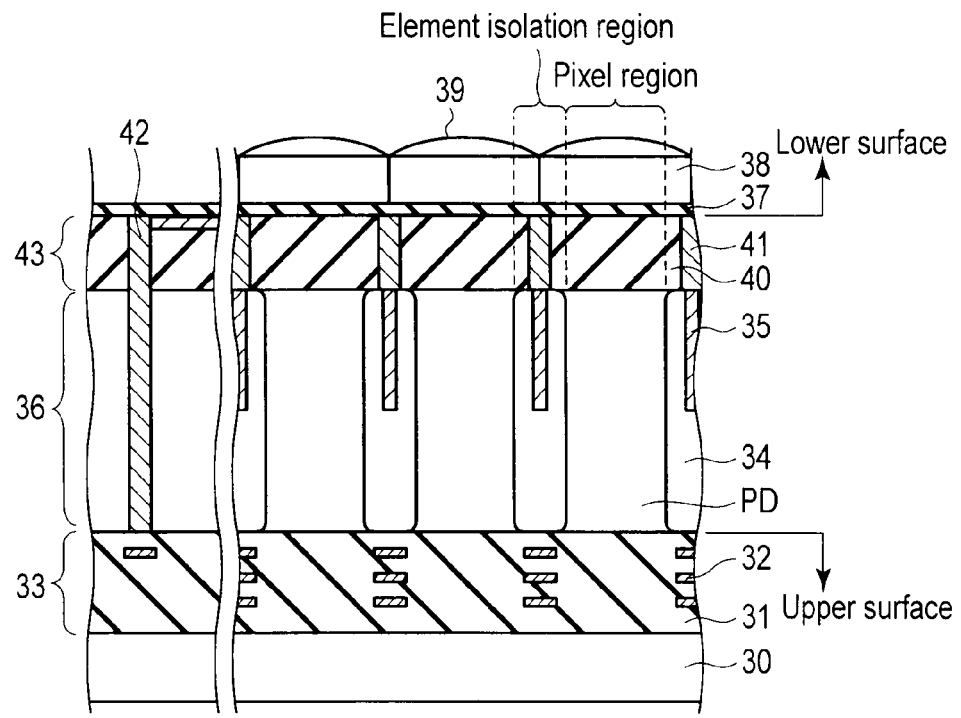
F I G. 6
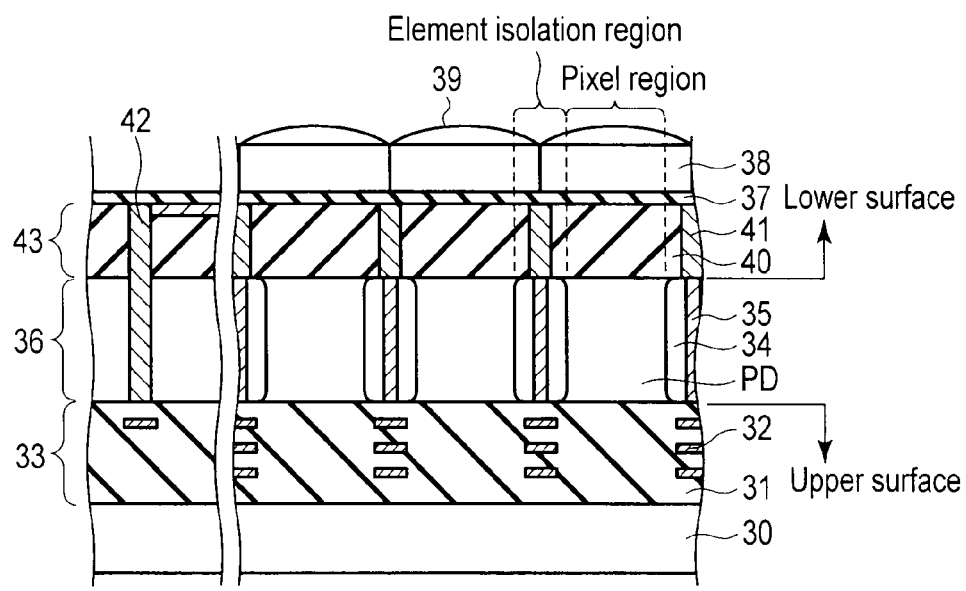
F I G. 7

BACKSIDE ILLUMINATION SOLID-STATE IMAGING DEVICE

CROSS-REFERENCE TO RELATED APPLICATIONS

This application is based upon and claims the benefit of priority from prior Japanese Patent Application No. 2010-160012, filed Jul. 14, 2010, the entire contents of which are incorporated herein by reference.

FIELD

Embodiments described herein relate generally to a backside illumination solid-state imaging device.

BACKGROUND

Recently, as a solid-state imaging device used for a digital camera, a CMOS (Complementary Metal Oxide Semiconductor) image sensor has been proposed and commercialized. The features of this CMOS image sensor are that it uses a single power supply, operates at a low voltage, and consumes low power.

The pixel sizes of CMOS image sensors have decreased year by year because of demands for larger numbers of pixels and smaller optical sizes. For example, a CMOS image sensor used for a digital camera or the like has a pixel size of about 2 μm to 3 μm. As the pixel size of a CMOS image sensor decreases, the openings between the interconnections through which light passes decrease in size, resulting in a decrease in sensitivity.

In order to solve this problem, a backside illumination image sensor has been developed, which has a signal scanning circuit and interconnection layer (circuit unit) on the upper surface of a semiconductor substrate, and a light-receiving surface on a side (rear surface side) opposite to the circuit unit. Using this structure can increase the sensitivity of the CMOS image sensor.

However, a backside illumination CMOS image sensor has no interconnection layer on the light incident surface side, and hence the semiconductor substrate is located immediately below the color filters. For this reason, light, especially light having a long wavelength, which strikes a given pixel at a certain angle (obliquely strikes the incident surface) propagates to an adjacent pixel without being interfered by the interconnection layer, thus causing crosstalk with the adjacent pixel and color mixing. This degrades color reproducibility on a reproduced picture, resulting in deterioration in image quality.

BRIEF DESCRIPTION OF THE DRAWINGS

FIG. 1 is a circuit diagram showing an example of the arrangement of a backside illumination CMOS image sensor according to each embodiment;

FIG. 6 is a sectional view taken along the line A-A in FIG. 2, showing a sectional structure of a backside illumination CMOS image sensor according to the second embodiment;

FIG. 7 is a sectional view showing the first modification of the backside illumination CMOS image sensor according to the second embodiment.

DETAILED DESCRIPTION

Figure 2:
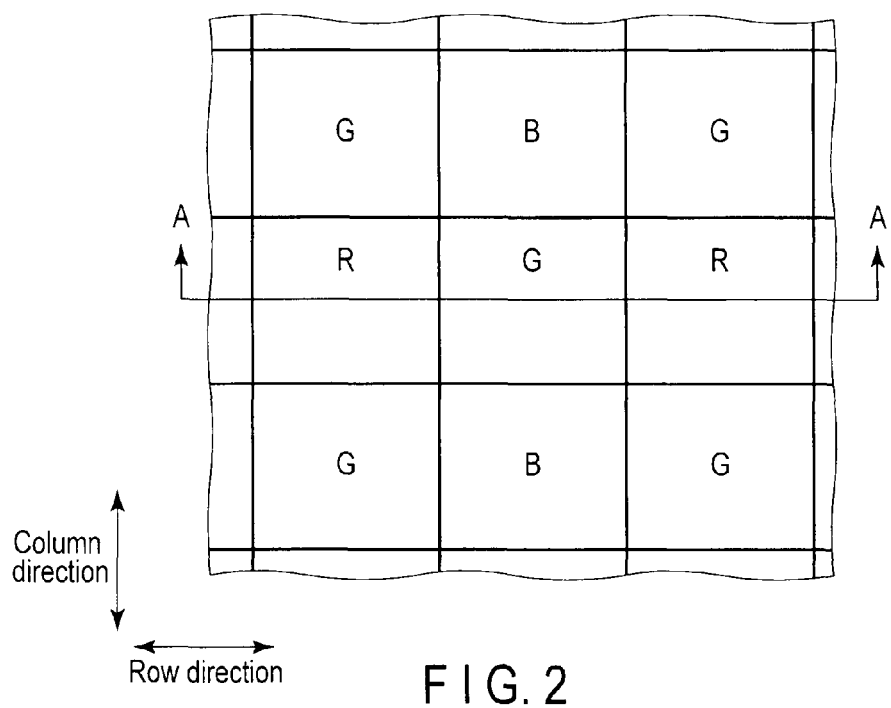
FIG. 2 is a plan view showing the arrangement of the backside illumination CMOS image sensor according to each embodiment.

In general, according to one embodiment, a backside illumination solid-state imaging device includes: a semiconductor layer; a first light-receiving unit and a second light-receiving unit; a circuit unit; an impurity isolation layer; and a light-shielding film. A first light-receiving unit and a second light-receiving unit are formed adjacent to each other in the semiconductor layer, convert light applied from a lower surface side of the semiconductor layer into a signal, and store electric charges. A circuit unit is formed on an upper surface of the semiconductor layer. An impurity isolation layer is formed to reach to the upper surface from the lower surface in the semiconductor layer and isolates the first light-receiving unit from the second light-receiving unit. A light-shielding film is formed on part of the lower surface side in the impurity isolation layer so as to extend from the lower surface to the upper surface.

This embodiment will be described below with reference to the views of the accompanying drawing. The same reference numerals denote the same parts throughout the views of the accompanying drawing.

<Example of Arrangement>

An example of the arrangement of a backside illumination CMOS image sensor according to each embodiment will be described first with reference to FIGS. 1 and 2.

FIG. 1 is a circuit diagram of the backside illumination CMOS image sensor according to each embodiment. A backside illumination CMOS image sensor having a two-pixel one-cell structure will be exemplified as a solid-state imaging device.

As shown in FIG. 1, a backside illumination CMOS image sensor includes a plurality of unit cells UC, a plurality of load transistors LT, a plurality of horizontal selection transistors ST, a horizontal register 11, a vertical register 12, and a timing generation circuit 13.

The plurality of unit cells UC are arranged in an array of, for example, 2n to 2(n+1)+1 rows and m to (m+2) columns. Each unit cell UC includes two photodiodes PDa and PDb, two transfer (read) transistors TGa and TGb corresponding to the photodiodes PDa and PDb, a reset transistor RS, an amplification transistor AMP, and an address transistor AD (two-pixel one-cell structure).

In each unit cell UC, the anode of the photodiode PDa is grounded, and its cathode is connected to one end of the current path of the transfer transistor TGa. The anode of the photodiode PDb is grounded, and its cathode is connected to one end of the current path of the transfer transistor TGb.

A read line READ is connected to the gate of each of the transfer transistors TGa and TGb, to which a read signal is supplied from the vertical register 12. The other end of each of the current paths of the transfer transistors TGa and TGb is commonly connected to the gate of the amplification transistor AMP. The node between the other end of each of the current paths of the transfer transistors TGa and TGb and the gate of the amplification transistor AMP becomes a floating diffusion FD.

One end of the current path of the amplification transistor AMP is connected to a vertical signal line Vsig, and its other end is connected to one end of the current path of the address transistor AD.

One end of the vertical signal line Vsig is connected to one end of the current path of the horizontal selection transistors ST, and its other end is connected to the load transistors LT. In addition, the vertical signal line Vsig extends in a direction to intersect a reset signal line RESET, the read line READ, and a horizontal address line ADRES.

The other end of the current path of the address transistor AD is connected to a current source. The gate of the address transistor AD is connected to the horizontal address line ADRES.

One end of the current path of a reset transistor RS is connected to the gate of the amplification transistor AMP, and its other end is connected to a voltage source. The reset signal line RESET is connected to the gate of the reset transistor RS, to which a reset signal is supplied from the vertical register 12.

The other end of the current path of the horizontal selection transistors ST is connected to an amplifier 14. The gate of the horizontal selection transistors ST is connected to the horizontal register 11. The horizontal register 11 supplies a selection pulse to the gate of the horizontal selection transistors ST.

The timing generation circuit 13 controls the horizontal register 11 and the vertical register 12.

Of the unit cells UC arranged in the mth to (m+2)th columns, for example, the unit cells UC arranged in an even-numbered column are respectively shifted from the unit cells UC arranged in an odd-numbered column by one row. In other words, two unit cells UC adjacent each other in the column direction are shifted from each other by one row. More specifically, the unit cells UC arranged in the mth and (m+2)th columns are respectively arranged in the 2nth and 2(n+1)th rows, whereas the unit cells UCs arranged in the (2m+1)th column are respectively arranged in the (2n+1)th and (2(n+1)+1)th rows.

In the unit cells UCs arranged in an even-numbered column and the unit cells UCs arranged in an odd-number column, the read lines READ connected to the photodiodes PDa and PDb (transfer transistors TGa and TGb) are respectively shifted from each other by one row. In other words, in the unit cells UC adjacent in the column direction, the read lines READ connected to the photodiodes PDa and PDb are respectively shifted from each other by one row. More specifically, in the two unit cells UC arranged in the 2nth row and the mth and (m+2)th columns, the photodiodes PDa and PDb are respectively connected to read lines READ[2n] and READ[2n+1]. On the other hand, in the unit cell UC arranged in the (2n+1)th row and the (m+1)th column, the photodiodes PDa and PDb are respectively connected to the read line READ[2n+1] and a read line READ[2(n+1)].

Referring to FIG. 1, the unit cells UC are arranged in two row×three columns. However, this embodiment is not limited to this arrangement.

FIG. 2 is a plan view showing the arrangement of the color filters of the backside illumination CMOS image sensor according to each embodiment.

Referring to FIG. 2, pixels R are pixels on which color filters transmitting mainly light in the red wavelength region are arranged, pixels G are pixels on which color filters transmitting mainly light in the green wavelength region are arranged, and pixels B are pixels on which color filters transmitting mainly light in the blue wavelength region are arranged.

As shown in FIG. 2, the pixels are arranged in a matrix form in the row and column directions. The color filters are arranged to acquire different color signals at the pixels adjacent in the row and column directions.

First Embodiment

The backside illumination CMOS image sensor according to the first embodiment will be described next with reference to FIGS. 3, 4, and 5.

[Structure]

Figure 3:
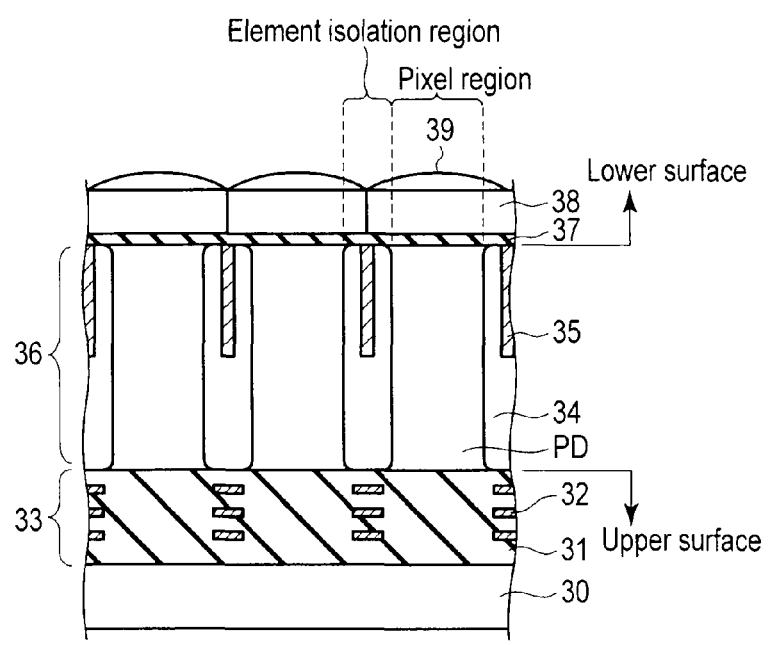
FIG. 3 is a sectional view taken along a line A-A in FIG. 2, showing a sectional structure of the backside illumination CMOS image sensor according to the first embodiment.

FIG. 3 is a sectional view taken along the line A-A in FIG. 2, showing a sectional structure of the backside illumination CMOS image sensor according to the first embodiment.

As shown in FIG. 3, the backside illumination CMOS image sensor according to the first embodiment includes a first interconnection layer (circuit unit) 33, a semiconductor layer 36, a planarization layer 37, color filters 38, microlenses 39, which are formed on a support substrate 30.

The first interconnection layer 33 is formed on the upper surface (the face surface) of the semiconductor layer 36. The first interconnection layer 33 includes an insulating layer 31 and interconnections 32 formed in the insulating layer 31. The first interconnection layer 33 includes the transfer transistors TG, the amplification transistors AMP, and the reset transistors RS shown in FIG. 1. The first interconnection layer 33 reads the electric charges stored in photodiodes PD (to be described later).

The planarization layer 37 is formed on the lower surface (the backside surface) of the semiconductor layer 36. The color filters 38 and the microlenses 39 are formed on the planarization layer 37 in correspondence with the pixel regions. That is, the lower surface of the semiconductor layer 36 serves as a light-receiving surface.

The semiconductor layer 36 is, for example, an n-type epitaxial layer. Light-receiving units (photodiodes) PD serving as pixel regions, impurity isolation layers 34 of, for example, a p type serving as element isolation regions, and light-shielding films 35 are formed in the semiconductor layer 36. In this case, the semiconductor layer 36 has a thickness of 1 µm to 5 µm, for example, about 4 µm.

Each light-receiving unit PD converts light applied from the lower surface side into a signal and stores electric charges. The light-receiving unit PD is surrounded by the impurity isolation layer 34. In other words, the impurity isolation layers 34 are formed on all the boundaries between the two adjacent light-receiving units PD to isolate the two adjacent light-receiving units PD from each other. The impurity isolation layers 34 extend from the lower surface of the semiconductor layer 36 and reach the upper surface of the semiconductor layer 36 through the interior. This makes the impurity isolation layers 34 completely isolate the two adjacent light-receiving units PD. The impurity isolation layers 34 are formed by implanting, for example, boron as impurity ions.

Each light-shielding film 35 is formed in a portion on the lower surface side in the semiconductor layer 36 so as to be formed in the impurity isolation layer 34. In other words, the light-shielding film 35 is formed to extend from the lower surface of the semiconductor layer 36 into the interior (to the upper surface side) of the semiconductor layer 36 and is covered with the impurity isolation layer 34. In addition, the light-shielding film 35 is in contact with the planarization layer 37 on the lower surface of the semiconductor layer 36. The light-shielding film 35 is formed by forming a trench in the semiconductor layer 36 and then embedding, for example, a metal or polysilicon having conductivity in the trench.

Although the light-shielding film 35 is preferably formed from a metal or polysilicon, it may be formed from an insulator for STI (Shallow Trench Isolation). The light-shielding film 35 preferably has reflectivity as well as a light-shielding effect. This improves the sensitivity of the pixel. The light-shielding film 35 has a width of about 0.5 µm to 5 µm. The depth of the light-shielding film 35 is at least equal to or more than 10% of the thickness of the semiconductor layer 36.

Figure 4:
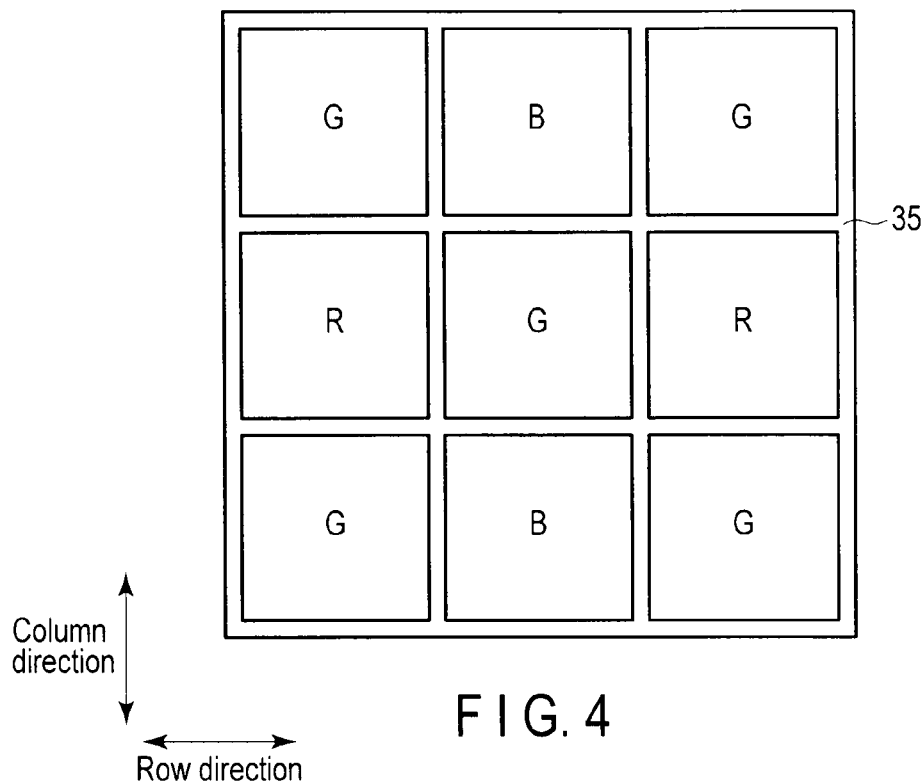
FIG. 4 is a plan view showing the arrangement of the backside illumination CMOS image sensor according to the first embodiment.

FIG. 4 is a plan view showing the arrangement of the color filters 38 and light-shielding films 35 of the backside illumination CMOS image sensor according to the first embodiment.

As shown in FIG. 4, the light-shielding films 35 are formed to isolate the pixels adjacent to each other in the row and column directions. Each light-shielding film 35 is continuously formed in the entire element isolation region.

[Effects]

According to the first embodiment described above, in the semiconductor layer 36 of the backside illumination CMOS image sensor, the impurity isolation layers 34 and the light-shielding films 35 are formed as element isolation regions. Light which obliquely strikes each pixel region is reflected by the light-shielding film 35 and is captured in the desired pixel. That is, forming the light-shielding film 35 as well as the impurity isolation layer 34 as the element isolation regions can improve the light-shielding effect between the adjacent pixels. This can therefore suppress crosstalk with the adjacent pixels, and hence can suppress deterioration in image quality in the backside illumination CMOS image sensor.

On the other hand, the process of forming the light-shielding film 35 may damage the surroundings. This generates a dark current in the surface layer of the light-shielding film 35. In contrast to this, in this embodiment, since the surroundings of the light-shielding film 35 are covered with the impurity isolation layer 34, it is possible to prevent the generation of a dark current. In addition, the impurity isolation layer 34 can completely isolate the upper surface side of the semiconductor layer 36 for which element isolation is performed insufficiently by using only the light-shielding film 35.

In photoelectric conversion of incident light, increasing the thickness of the light-receiving unit (photodiode) PD can effectively increase the optical path length. In order to achieve a reduction in the size of the CMOS image sensor, the light-receiving unit PD is required to be thinner. In contrast to this, in this embodiment, each light-shielding film 35 can reflect light within the pixel. Even if, therefore, the light-receiving unit PD is made thinner, the optical path length can be increased in effect. It is therefore possible to decrease the thickness of the light-receiving units PD and achieve a reduction in the size of the CMOS image sensor.

Figure 5:
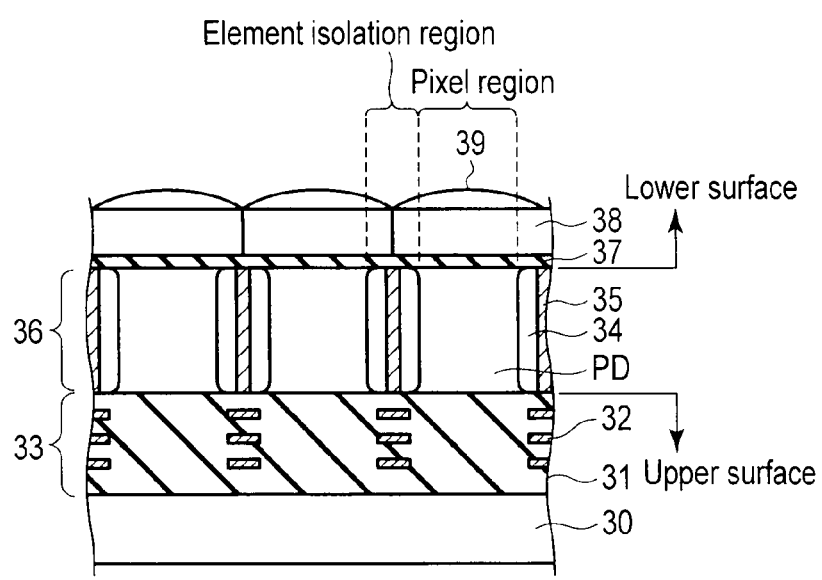
FIG. 5 is a sectional view showing a modification of the backside illumination CMOS image sensor according to the first embodiment.

As shown in FIG. 5, each light-shielding film 35 may be formed to extend from the lower surface of the semiconductor layer 36 and reach the upper surface of the semiconductor layer 36. This makes the light-shielding film 35 completely isolate the adjacent pixels and can further improve the light-shielding effect between the adjacent pixels. In addition, forming the light-shielding film 35 in contact with the first interconnection layer 33 can directly apply the ground voltage or negative bias from the first interconnection layer 33 to the light-shielding film 35. This makes it possible to reduce the voltage at each element isolation region and reinforce the element isolation between the pixels. According to the structure shown in FIG. 5, if the semiconductor layer 36 is thick, it is difficult, from the viewpoint of manufacture, to form the light-shielding film 35 up to the upper surface (the first interconnection layer 33 side). For this reason, the semiconductor layer 36 preferably has a thickness of 1 µm to 3 µm, for example, about 2 µm.

Second Embodiment

A backside illumination CMOS image sensor according to the second embodiment will be described next with reference to FIGS. 6, 7, and 8. Note that only different points between the first and second embodiments will be described in detail below while a description of the same points will be omitted.

[Structure]

FIG. 6 is a sectional view taken along the line A-A in FIG. 2, showing a sectional structure of the backside illumination CMOS image sensor according to the second embodiment.

As shown in FIG. 6, the backside illumination CMOS image sensor according to the second embodiment includes a first interconnection layer (circuit unit) 33, a semiconductor layer 36, a second interconnection layer 43, a planarization layer 37, color filters 38, and microlenses 39, which are formed on a support substrate 30. The backside illumination CMOS image sensor according to the second embodiment differs from that according to the first embodiment in that it includes the second interconnection layer 43.

The first interconnection layer 33 is formed on the upper surface of the semiconductor layer 36. The first interconnection layer 33 includes an insulating layer 31 and interconnections 32 formed in the insulating layer 31.

Light-receiving units (photodiodes) PD serving as pixel regions, impurity isolation layers 34 of, for example, a p type serving as element isolation regions, and light-shielding films 35 are formed in the semiconductor layer 36. In this case, the semiconductor layer 36 has a thickness of, for example, about 4 µm.

Each light-receiving unit PD converts light applied from the lower surface side into a signal and stores electric charges. The light-receiving unit PD is surrounded by the impurity isolation layer 34. In other words, the impurity isolation layers 34 are formed on all the boundaries between the two adjacent light-receiving units PD to isolate the two adjacent light-receiving units PD from each other.

Each light-shielding film 35 is formed in a portion on the lower surface side in the semiconductor layer 36 so as to be formed in the impurity isolation layer 34. In other words, the light-shielding film 35 is formed to extend from the lower surface of the semiconductor layer 36 into the interior (to the upper surface side) of the semiconductor layer 36 and is covered with the impurity isolation layer 34. In addition, the light-shielding film 35 is in contact with the second interconnection layer 43 (interconnection 41) (to be described later) on the lower surface of the semiconductor layer 36. The light-shielding film 35 is formed from a metal or polysilicon having conductivity.

The second interconnection layer 43 is formed on the lower surface of the semiconductor layer 36. The second interconnection layer 43 includes an insulating layer 40, the interconnections 41 formed in the insulating layer 40, and through-vias 42.

The interconnections 41 are formed in the element isolation regions so as to extend through the insulating layer 40. For this reason, each interconnection 41 is in contact with and electrically connected to the light-shielding film 35 on the lower surface of the semiconductor layer 36. The interconnections 41 are formed from, for example, a metal having conductivity.

The interconnection 41 is further electrically connected to the first interconnection layer 33 via the through-via 42 formed in, for example, in a peripheral circuit region so as to extend through the insulating layer 40 and the semiconductor layer 36. The through-via 42 is formed from, for example, a metal having conductivity. That is, it is possible to apply a voltage from the first interconnection layer 33 to the light-shielding film 35 via the through-via 42 and the interconnection 41. More specifically, a ground voltage or a negative bias is applied from the first interconnection layer 33 to the light-shielding film 35.

The planarization layer 37 is formed on the second interconnection layer 43. The color filters 38 and the microlenses 39 are formed on the planarization layer 37 in correspondence with the pixel regions.

Referring to FIG. 6, the planarization layer 37 is formed on the second interconnection layer 43. However, the planarization layer 37 may be integrally formed with the insulating layer 40. That is, it is possible to use the planarization layer 37 or a reflecting film (not show) as the insulating layer 40 in the second interconnection layer 43.

Note that the interconnections 41 are all continuously formed in the element isolation regions like the light-shielding film 35 shown in FIG. 4.

[Effects]

The second embodiment can obtain the same effects as those in the first embodiment.

In addition, according to the second embodiment, the second interconnection layer 43 is formed on the lower surface of the semiconductor layer 36. It is possible to apply a ground voltage or a negative bias to each light-shielding film 35 through the second interconnection layer 43. This can decrease the voltage to be applied to the element isolation region and reinforce element isolation between the pixels.

Furthermore, as shown in FIG. 7, each light-shielding film 35 may be formed to extend from the lower surface of the semiconductor layer 36 and reach the upper surface of the semiconductor layer 36. This allows the light-shielding film 35 to completely isolate the adjacent pixels and can further improve the light-shielding effect between the adjacent pixels. In addition, forming the light-shielding film 35 in contact with the first interconnection layer 33 can also apply a ground voltage or a negative bias from the first interconnection layer 33 to the light-shielding film 35 and further reinforce element isolation between the pixels. In the structure shown in FIG. 7, it is preferable, from the viewpoint of the manufacture of the light-shielding film 35, to make the semiconductor layer 36 have a thickness of 1 µm to 3 µm, for example, about 2 µm.

Figure 8:
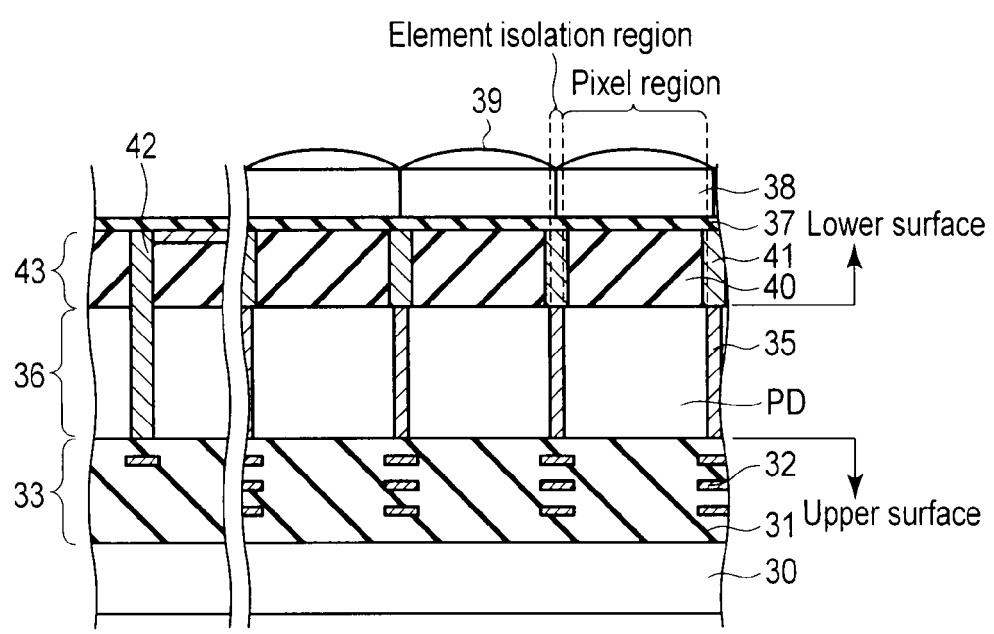
FIG. 8 is a sectional view showing the second modification of the backside illumination CMOS image sensor according to the second embodiment.

In addition, as shown in FIG. 8, the impurity isolation layers 34 need not be formed. That is, forming element isolation regions by using only the light-shielding films 35 can increase the regions of the light-receiving units PD. In the structure shown in FIG. 8, it is preferable, from the viewpoint of the manufacture of the light-shielding film 35, to make the semiconductor layer 36 have a thickness of 1 µm to 3 µm, for example, about 2 µm. In addition, since the impurity isolation layers 34 are not formed, a dark current may be generated in the surface layer of each light-shielding film 35. In this embodiment, however, it is possible to collect holes in the surface layer of each light-shielding film 35 by applying a negative bias to the light-shielding film 35 via the second interconnection layer 43 (or directly from the first interconnection layer 33). This can suppress the generation of a dark current in the surface layer of the light-shielding film 35.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A backside illumination solid-state imaging device comprising:
    a semiconductor layer;
    a first light-receiving unit and a second light-receiving unit which are formed adjacent to each other in the semiconductor layer, convert light applied from a lower surface side of the semiconductor layer into a signal, and store electric charges;
    a circuit unit which is formed on an upper surface of the semiconductor layer and reads electric charges stored in the first light-receiving unit and the second light-receiving unit;
    an impurity isolation layer which is formed to reach to the upper surface from the lower surface in the semiconductor layer and isolates the first light-receiving unit from the second light-receiving unit; and
    a light-shielding film which is formed on part of the lower surface side in the impurity isolation layer so as to extend from the lower surface to the upper surface.

2. The device of claim 1, further comprising an interconnection which is formed on the lower surface of the semiconductor layer to apply one of a ground voltage and a negative bias to the light-shielding film,
    wherein the light-shielding film has conductivity.

3. The device of claim 2, wherein the interconnection applies one of a ground voltage and a negative bias from the circuit unit to the light-shielding film via a through-via formed to reach to the upper surface from the lower surface in the semiconductor layer.

4. The device of claim 1, wherein the light-shielding film is formed to reach to the upper surface from the lower surface in the semiconductor layer.

5. The device of claim 1, wherein the semiconductor layer is of an n type, and the impurity isolation layer is of a p type.

6. The device of claim 1, wherein boron is introduced into the impurity isolation layer.

7. The device of claim 1, wherein the light-shielding film includes one of a metal and polysilicon.

8. The device of claim 1, wherein the light-shielding film includes an insulator.

9. The device of claim 1, wherein the light-shielding film has reflectivity.

10. The device of claim 1, wherein the light-shielding film has a width of 0.5 µm to 5 µm, and the semiconductor layer has a thickness of 1 µm to 5 µm.

11. The device of claim 4, wherein the light-shielding film has a width of 0.5 µm to 5 µm, and the semiconductor layer has a thickness of 1 µm to 3 µm.

12. The device of claim 4, wherein the circuit unit directly applies one of a ground voltage and a negative bias to the light-shielding film.

13. The device of claim 1, wherein a depth of the light-shielding film is not less than 10% of a thickness of the semiconductor layer.

14. A backside illumination solid-state imaging device comprising:
    a semiconductor layer;
    a first light-receiving unit and a second light-receiving unit which are formed adjacent to each other in the semiconductor layer, convert light applied from a lower surface side of the semiconductor layer into a signal, and store electric charges;

a circuit unit which is formed on an upper surface of the semiconductor layer and reads electric charges stored in the first light-receiving unit and the second light-receiving unit;

a light-shielding film having conductivity which is formed to reach the upper surface from the lower surface in the semiconductor layer and isolates the first light-receiving unit from the second light-receiving unit; and an interconnection which is formed on the lower surface of the semiconductor layer and applies one of a ground voltage and a negative bias to the light-shielding film.

15. The device of claim 14, wherein the interconnection applies one of a ground voltage and a negative bias from the circuit unit to the light-shielding film via a through-via formed to reach the upper surface from the lower surface in the semiconductor layer.

16. The device of claim 14, wherein the light-shielding film includes one of a metal and polysilicon.

17. The device of claim 14, wherein the light-shielding film has reflectivity.

18. The device of claim 14, wherein the light-shielding film has a width of 0.5 μm to 5 μm, and the semiconductor layer has a thickness of 1 μm to 3 μm.

19. The device of claim 14, wherein the circuit unit directly applies one of a ground voltage and a negative bias to the light-shielding film.

* * * * *